July 27, 1965 J. ANTONIO ETAL 3,197,709

PULSE SEMICONDUCTOR AMPLIFIER WITH A REDUCED LEAKAGE CURRENT EFFECT

Filed June 5, 1962

INVENTORS
John Antonio
Ralph Townsend

BY Louis Etlinger
ATTORNEY

United States Patent Office 3,197,709
Patented July 27, 1965

3,197,709

PULSE SEMICONDUCTOR AMPLIFIER WITH A REDUCED LEAKAGE CURRENT EFFECT

John Antonio, Fairfield, and Ralph Townsend, Darien, Conn., assignors to Sperry Rand Corporation, New York, N.Y., a corporation of Delaware Filed June 5, 1962, Ser. No. 200,168
4 Claims. (Cl. 330—18)

This invention relates to amplifiers, and, more particularly, to semiconductor amplifiers in which the effects of temperature variations on the output are minimized.

Due to the more efficient operation and the small rate of failure, semiconductor devices have found increasing usage in communication and control equipment. In spite of the advantages of the semiconductors, the poor temperature stability of germanium has heretofore restricted its use. This is particularly true in the case of data processing equipment where large numbers of transistor amplifiers are required. In perforated card equipment, for example, the cards contain 80 or 90 columns of information and all columns are often sensed simultaneously. This requires 80 or 90 channels, all of which must contain amplifiers. To compensate for the variations in the output of germanium amplifiers with variations in ambient temperature, it has been common to utilize feedback circuits with additional semiconductor amplifiers as compensating networks. This greatly increases the initial cost of the equipment, its complexity, and its consequent maintenance costs. Silicon semiconductors could be substituted for germanium since they have a better temperature characteristic, but at this time the silicon devices are considerably more expensive and in equipment which uses a large number of transistors, the additional cost becomes a major factor.

In germanium semiconductor amplifiers, the leakage current $I_{co}$ which flows between collector electrode and the base electrode increases exponentially with temperature, and doubles in value for each 8–11 degree centigrade rise in temperature of the germanium. This occurs in the normal operating range of 10°–50° C. Since the leakage current $I_{co}$ is not steady and results as noise in the output, the output noise often rises to a value greater than the intelligence. When a chain of direct coupled amplifiers is used in any channel, the situation becomes worse, and the compensating circuits often become very complex.

It is therefore, an object of this invention to provide a new and improved semiconductor amplifier.

It is another object of this invention to provide a new and improved amplifier in which the effects of changes in temperature are minimized.

It is a further object of this invention to provide a new and improved semiconductor amplifier which is pulsed to increase the signal to noise ratio in its output.

Other objects and advantages of this invention will become more apparent as the following description proceeds, which description should be considered together with the accompanying drawings in which.

Figure 1:
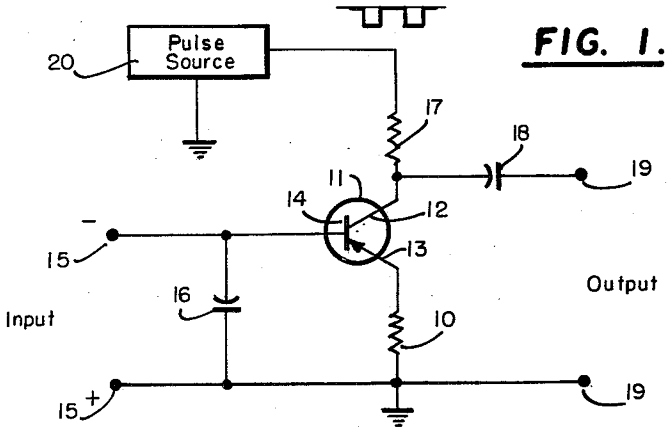
FIG. 1 is a schematic circuit diagram of the basic amplifier of this invention.
Figure 2:
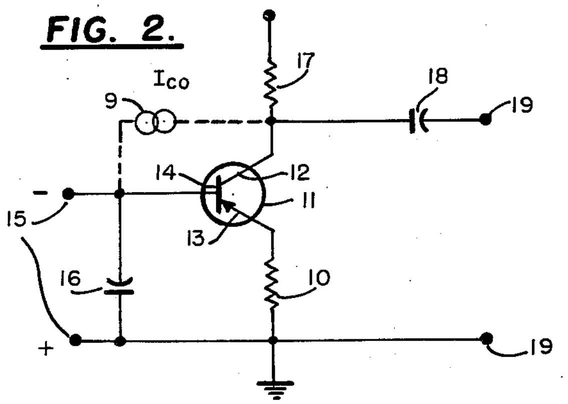
FIG. 2 is a schematic circuit diagram of the amplifier of FIG. 1 showing the leakage current.

Referring now to the drawings in detail and to FIGS. 1 and 2 in particular, the reference character 11 designates a transistor having a collector electrode 12, an emitter electrode 13, and a base electrode 14. The transistor 11 is shown as a PNP type, but it should be understood that it could just as well be an NPN type. The input signal is applied to the base electrode 14 from input terminals 15 across an input capacitor 16. A resistor 10 connects the emitter electrode 13 to ground, and the collector electrode 12 is connected through a resistor 17 to a source of pulsating electrical potential. Output terminals 19 are connected to ground and to the junction of the collector electrode and resistor 17. In the amplifier of FIG. 1 the input signals are applied to the input terminals 15 and from there to the base electrode 14. When the source 20 supplies a negative power pulse to the collector electrode 12, it also, in effect, drives the emitter electrode 13 positive, setting up conduction between the base and emitter electrodes. This reduces the internal impedance of the transistor 11 and current begins flowing in the emitter-collector circuits. The output signal is taken from output terminals 19. So long as the collector electrode 12 is energized from the source 20, current will flow, at least in the collector-base circuit.

This is exemplified in FIG. 2 by the A.C. generator 9, representing leakage current $I_{co}$, shown connected by dashed lines between the collector electrode 12 and the base electrode 14. Whenever energizing potential is applied between the collector electrode and ground, and a potential difference exists between the base electrode 14 and the collector electrode 12, current will flow between these two electrodes. As the temperature of the transistor 11 increases, the conductivity of the transistor 11 increases, and the leakage current $I_{co}$ also increases; about double for each 10° C. increase in temperature as mentioned above. This increase in leakage current causes a change in the output of the circuit. In addition, the leakage current $I_{co}$ constantly flowing through the body of the transistor 11 increases the resistive loss in the circuit and adds slightly to the heating of that body.

Since the leakage current $I_{co}$ is not constant in nature, it appears as noise in the output of the transistor 11. When the leakage current becomes large, it tends to decrease the signal to noise ratio of the circuit and masks the intelligence being amplified by the circuit. To overcome this effect due to changes in temperature, this invention contemplates pulsing the noise rather than pulsing the intelligence signal. In the past when the intelligence and the noise signals were of similar amplitudes and the noise tended to mask the intelligence, it was the practice to pulse the intelligence signal so that it could be distinguished from the noise. However, it has been found that pulsing the noise in transistor amplifiers reduces the effect of the noise on the output and permits the longer intelligence signal to be readily isolated.

Figure 3:
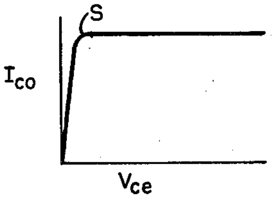
FIG. 3 is a curve setting forth the relationship between the leakage current and the collector potential.

To accomplish this, the capacitor 16 is provided to integrate the input signal and ensure its long duration. At the same time, the energy from the source 20 is pulsed when it is supplied to the collector electrode 12. FIG. 3 illustrates the effect the collector potential has upon the leakage current $I_{co}$. As the potential applied to the collector electrode 12 rises from zero to operating potential, so does the value of the leakage current until the point S on the curve is reached. At this point, further increases in the potential applied to the collector electrode 12 have little effect on the leakage current. By applying the potential to the collector electrode 12 as a series of pulses of short duration, the overall effect is to reduce the average potential applied to the collector electrode 12. This also reduces the integrated value of the leakage current and its effect on the output. Capacitor 16 stores the input intelligence signal so that it varies very slowly with respect to the variations in the leakage current. Since, during the pulsing of the transistor 11, the intelligence signal tends to remain substantially constant, and the noise signal represented by the leakage current is varying, the intelligence is readily distinguishable. In addition, in the process of integration which occurs in capacitor 18 at the output, some of the noise tends to cancel itself out by its random nature, but the substantially constant intelligence signal persists in amplified form.

The operation of the circuit can be explained in another way. The transistor 11 is pulsed by the application of energizing pulses to the collector electrode 12 for a very short time interval. Suppose, for this discussion, that an intelligence signal current of 20$\mu$ amperes is flowing through capacitor 16, which is 0.01 $\mu$f capacitance, to charge that capacitor to 100 mv. Also suppose a 1:1 current signal to noise ratio with 20$\mu$ amperes of leakage current flowing from collector electrode 12 to base electrode 14 to affect the charge on the capacitor 16. By pulsing the collector electrode 12 from 0 to operating potential for an interval of only 10$\mu$ seconds, the leakage current flows for only 10$\mu$ seconds. Thus, $$\Delta v=\frac{i\Delta t}{C}=\frac{20\times 10^{-6}\times 10\times 10^{-6}}{0.01\times 10^{-6}}=20 \text{ mv.}$$

From this it can be seen that although the current flows of the intelligence and the noise were in a ratio of 1:1, the voltage signal to noise ratio is 5:1.

Figure 4:
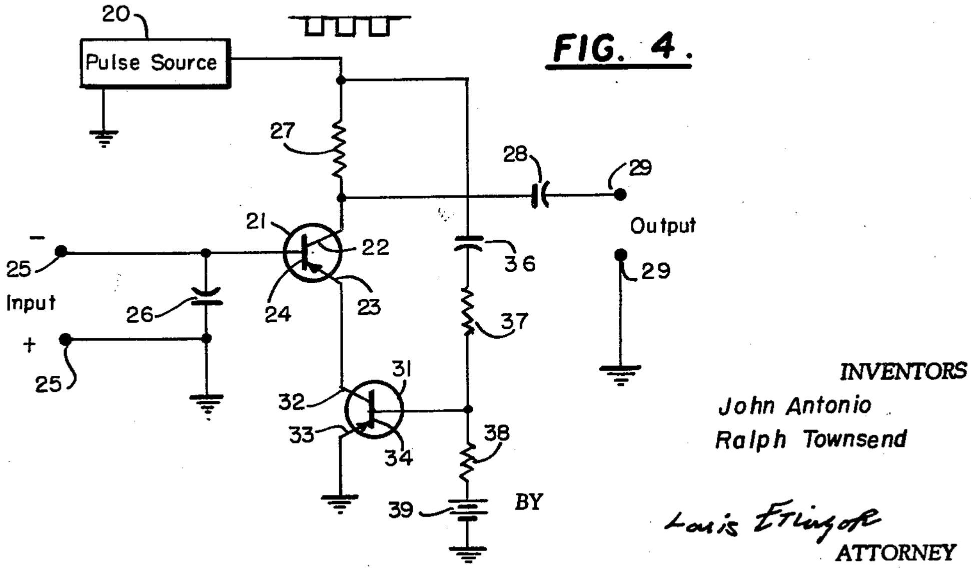
FIG. 4 is a schematic diagram of a second form of the amplifier of this invention.

A modified version of the circuit of FIG. 1 is illustrated in FIG. 4. A first transistor 21 having a collector electrode 22, an emitter electrode 23, and a base electrode 24 has an input signal applied to the base electrode 24 from input terminals 25 across a capacitor 26. The emitter electrode 23 is connected to a collector electrode 32 of a second transistor 31 which also has an emitter electrode 33 and a base electrode 34. The collector electrode 22 of the transistor 21 is connected through a resistor 27 to a source 20 of pulsating electrical energy. The junction of the collector electrode 22 and the resistor 27 is connected to an output terminal 29 through a capacitor 28, the other output terminal 29 being connected to ground. The emitter electrode 33 of the transistor 31 is also connected to ground, and the base electrode 34 is connected through a resistor 38 and a source of direct current, such as battery 39, to ground and, through a resistor 37 and a capacitor 36, to the source 20 of pulsating electrical energy.

The amplifier of FIG. 4 is similar in operation to that of FIG. 1, but it uses a second transistor 31 to ensure more positive cut-off and turn-on and better temperature compensation. When the source 20 applies negative potentials to the collector electrode 22 of the transistor 21 and to the base electrode 34 of the transistor 31, the transistor 21 is energized and current may flow therethrough. However, until the impedance of the collector-emitter circuit of the transistor 31 drops when that transistor becomes conductive, no current will flow in the series conduction paths of the two transistors. Thus, at the same time that energizing potentials are applied to the collector-emitter circuit of the transistor 21, the base-emitter circuit of transistor 31 has signals applied to it. The impedance of transistor 31 drops and that transistor becomes conductive. Current then flows from the source 20, through the resistor 27, the collector 22, the emitter 23, the collector 32 and the emitter 33 to ground. Normally, the battery 39 biases the transistor 31 to cut-off, but the application of a negative potential from the source 20 overcomes the bias to render the transistor 31 conductive for the duration of the negative potential.

As in the amplifier of FIG. 1, the input signal charges the capacitor 26 to a value determined by the input potential. When leakage current $I_{co}$ flows from the collector electrode 22 to the base electrode 24, the charge on the capacitor 26 is varied. Since the leakage current flows only during the application of the negative potential from the source 20 to the collector electrode 22, the average charge on the capacitor 26, and therefore the potential across it, is varied only a small amount by the leakage current. Since the output impedance of the circuit of FIG. 4 depends not only upon the impedance of the transistor 21 but also upon the impedance of the transistor 31 which is in series with the first transistor, there is less variation in the output impedance of the amplifier and in the overall gain with changes in temperature.

This specification has described a new and improved transistor amplifier which is arranged to minimize the effects of temperature in both the leakage current in the transistor and in the overall gain of the amplifier. It is realized that this specification will indicate to those skilled in the art other forms of utilizing the principles of this invention, and it is, therefore, intended that this invention be limited only by the scope of the appended claims.

What is claimed is:

1. An amplifier comprising a first transistor having a first collector electrode, a first base electrode, said first collector electrode adapted to be connected to an output receiver circuit; and a first emitter electrode; means for applying an input signal to be amplified between said first base electrode and ground; means connected between said first base electrode and ground to integrate said applied input signal; a second transistor having a second collector electrode, a second base electrode, and a second emitter electrode; said first emitter electrode being connected to said second collector electrode; means for connecting said second emitter electrode to ground to form a series path from said first collector electrode, through said first transistor, said first emitter electrode, said second collector electrode, through said second transistor, and said second emitter to ground; circuit means connected across said first collector electrode and ground to receive an output signal from said first and second transistors and means for simultaneously applying an intermittent potential between both the common junction provided between said first collector electrode and said second base electrode and ground to simultaneously energize said first transistor and to render said second transistor conductive.

2. The amplifier defined in claim 1 wherein said means connected between said first base electrode and ground to integrate said applied input signal comprises a capacitor.

3. The amplifier defined in claim 1 further including a source of electrical potential connected between said second base electrode and ground to bias said second transistor to a normally non-conductive state.

4. A transistor amplifier comprising a first transistor having a first collector electrode, a first base electrode and a first emitter electrode; a second transistor having a second collector electrode, a second base electrode and a second emitter electrode; a first capacitor connected between said first base electrode and ground; means for applying an input signal to be amplified across said first capacitor; means for connecting said first emitter electrode to said second collector electrode; means for connecting said second emitter electrode to ground; a source of bias potential connected between said second base electrode and ground; and means for simultaneously applying electrical potentials to said first collector electrode and to said second base electrode to overcome said bias and render said second transisor conductive and to energize the series circuit comprising said first collector-emitter path and said second collector-emitter path to establish conduction through said two collector-emitter paths; said electrical potential applied to said second base and said first collector electrodes being periodically applied and of short duration.

References Cited by the Examiner

UNITED STATES PATENTS

| | | | |
|---|---|---|---|
| 2,889,467 | 6/59 | Endres et al. | 307—88.5 |
| 2,964,711 | 12/60 | Steinke | 330—70 |
| 2,987,627 | 6/61 | Eckert | 330—27 X |
| 2,987,633 | 6/61 | Pallas | 307—88.5 |
| 2,995,664 | 8/61 | Deuitch | 307—88.5 |

ROY LAKE, *Primary Examiner*.

NATHAN KAUFMAN, *Examiner*.